(12) United States Patent
Webb

(10) Patent No.: US 7,646,543 B2
(45) Date of Patent: Jan. 12, 2010

(54) DISTORTION TUNING OF QUASI-TELECENTRIC LENS

(75) Inventor: James Edson Webb, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/922,183

(22) PCT Filed: Apr. 26, 2007

(86) PCT No.: PCT/US2007/010044

§ 371 (c)(1),
(2), (4) Date: Dec. 12, 2007

(87) PCT Pub. No.: WO2007/130299

PCT Pub. Date: Nov. 15, 2007

(65) Prior Publication Data

US 2009/0231724 A1 Sep. 17, 2009

(51) Int. Cl.
*G02B 13/22* (2006.01)
(52) U.S. Cl. ..................................................... 359/663
(58) Field of Classification Search ................... 359/663
See application file for complete search history.

(56) References Cited

U.S. PATENT DOCUMENTS

2002/0149756 A1    10/2002    Tokuda et al. ................. 355/53

*Primary Examiner*—Darryl J Collins
(74) *Attorney, Agent, or Firm*—Timothy M Schaeberle

(57) ABSTRACT

A non-linear modification to telecentric object space together with alteration of working distance provides a distortion adjustment feature. The modification to telecentric object space can be manifest as a spherical aberration in an entrance pupil. The change in working distance can be made by relatively translating the imaged object through the modified telecentric object space. The distortion adjustment can be made to compensate for distortions accompanying changes in ambient or operating conditions. Distortions accompanying magnification corrections can also be corrected.

37 Claims, 6 Drawing Sheets

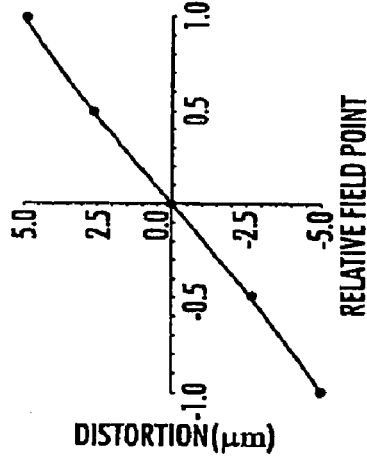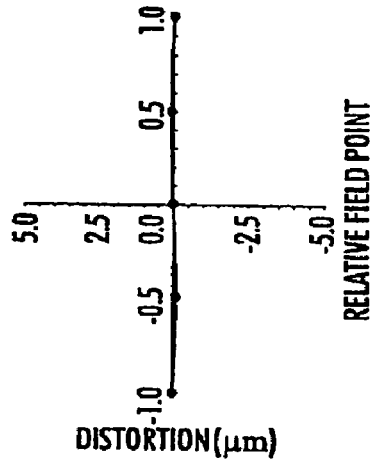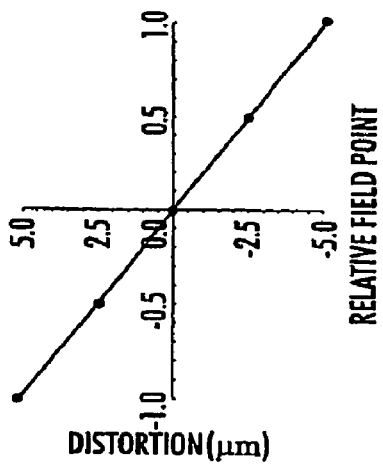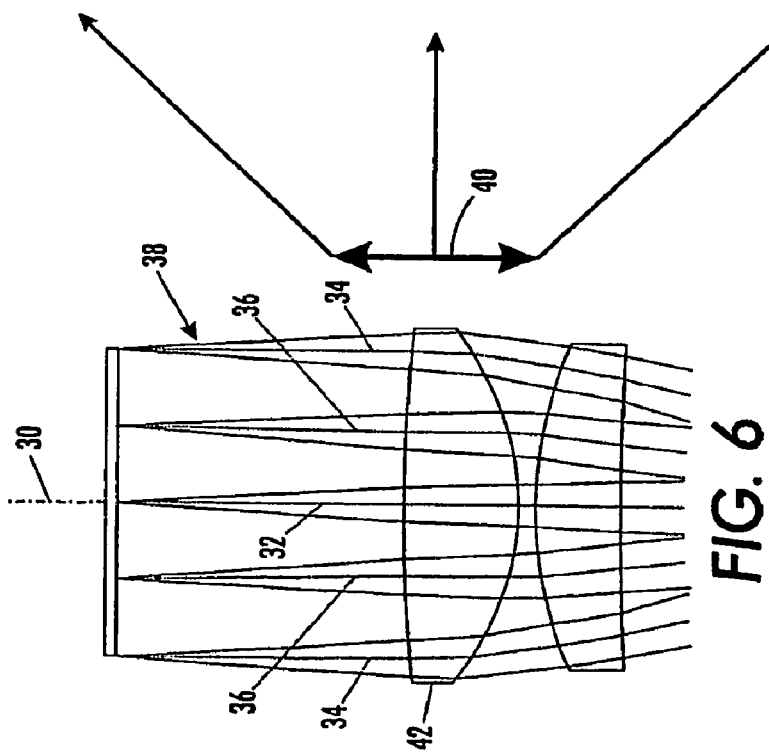

DISTORTION TUNING OF QUASI-TELECENTRIC LENS

TECHNICAL FIELD

The invention is directed to quasi-telecentric lenses subject to variations in image distortion with use and is particularly directed to distortion adjustment features of such lenses to compensate for such variations during use.

BACKGROUND OF THE INVENTION

Environmental factors such as temperature and pressure, as well as other factors such as component heating during use, can affect the refractive indices or spacing of optical components within lenses, and these changes can result in changes in magnification and image distortion. Such dynamic changes are apparent in many types of lenses including doubly-telecentric lenses.

Magnification adjustments have been made by axially translating certain optical elements of projection lenses. However, other optical aberrations including image distortions can accompany such magnification adjustments.

SUMMARY OF THE INVENTION

The invention contemplates a solution to the problem of radial distortion accompanying the use of telecentric lenses. The solution has two main parts. First, telecentric object space is deliberately altered in a non-linear fashion, which can be manifest, for example, as a spherical aberration in an entrance pupil. Second, the imaged object, together with its object plane, is relatively translated axially through the altered telecentric object space for adjusting radial distortion of the lens. The adjustments can be made dynamically to correct distortion errors caused by environmental influences or other factors accompanying the operation of the lens. Such distortion adjustments can also be paired with magnification adjustments to manage both dynamically.

In true telecentric object space, the chief rays emanating from the object plane all extend parallel to the optical axis. In one example of an altered telecentric space exploited here for purposes of adjustment, the chief rays preferably follow a pattern in which the chief paraxial and full-field rays extend parallel to the optical axis but chief intermediate rays vary in angle with respect to the optical axis by amounts that tend to increase with radial distance from both the chief paraxial and the full-field rays. The chief intermediate rays are preferably inclined slightly toward the optical axis.

Although the modified lens departs slightly from telecentricity, no significant distortion is evident in the image plane. In addition, the lens preferably remains uniformly telecentric at the image plane. Although telecentricity is not a requirement for good imaging, telecentricity does impose additional design constraints, generally for the purpose of reducing unwanted magnification changes with changes in working distance. The alteration to telecentric object space is incorporated into the lens design so that at a given position of the object plane no significant radial distortion is evident in the image plane. However, if the object plane is axially shifted in either direction along the optical axis (i.e., a change in working distance), positive or negative radial distortion can be introduced into the image. Preferably, the lens design remains sufficiently telecentric so that changes in working distance do not significantly alter magnification, but the lens design departs sufficiently from ideal telecentricity so that the changes in working distance produce radial distortion. The radial distortion adjustments, which can be made by axially translating the imaged object through the modified telecentric object space, can be determined in advance and recorded in a lookup table to make automatic corrections accompanying monitored changes in temperature or pressure.

Magnification adjustments can be made by axially translating one of the powered optical components of the lens. The chosen powered optical component is preferably one whose axial translation has the least effect on other distortions (i.e., beyond radial distortion or magnification). Good candidates are the first and last optical components of the lens adjacent to telecentric image or object space. In addition to changes in magnification, radial distortion can also be produced by such translations. However, the imaged object defining the object plane can be moved in addition to the chosen lens component to isolate the magnification correction. For example, the imaged object can be axially translated together with the chosen lens component closest to the object plane for correcting magnification independently of radial distortion. Compound changes in radial distortion and magnification can also be made by translating both the object and the chosen lens component.

The translation of the imaged object and the chosen lens component can also affect the location of the image plane. To restore the image plane to its initial location, the entire lens together with the imaged object can be translated. Alternatively, the receptor (not shown) on which the image is formed can be similarly translated to accommodate the altered location of the image plane.

To exploit more fully the imaging and adjustment possibilities of the subject invention, particularly in the form of a projection lens system, an illuminator is preferably matched to the quasi-telecentric projection lens envisioned for the invention. For example, the chief ray pattern emitted from the illuminator (e.g., at the image plane of the illuminator) can be matched to the non-linear chief ray pattern at the object plane of the projection lens so that the entrance pupil of the projection lens is at least partially filled according to the design. This allows the light patterns through which the object points are projected onto the image plane to be matched throughout the field. Preferably, the centroids of light energy associated with each of the points are aligned with the chief rays and oriented parallel to the optical axis at the image plane. The illuminator can be coupled directly to the projection lens or through a relay lens, which can either transmit or participate in forming the matching chief ray illumination pattern. For example, the relay could participate in forming the desired illumination pattern by converting a telecentric output from a conventional illuminator into the quasi-telecentric input required for matching the chief ray pattern of the projection lens.

One example of an optical imaging system arranged in accordance with the invention includes a quasi-telecentric lens assembly in which chief rays emanating from an object plane include paraxial rays and reference rays that are located at a given radial distance from the paraxial rays. Both the reference rays and the paraxial rays extend parallel to an optical axis of the lens assembly, and other of the chief rays vary in inclination to the optical axis of the imaging system substantially as a function of the radial distance of the other chief rays from the closer of the paraxial and the reference rays. A stage relatively translates an object intended for imaging by the imaging system with respect to the lens assembly along the optical axis to compensate for distortion otherwise apparent in an image plane of the lens assembly.

Preferably, the chief reference rays include chief full-field rays. In addition, the chief rays are preferably arranged to express a spherical aberration within an entrance pupil of the lens assembly. The other chief rays between the chief paraxial and full-field rays preferably include chief intermediate rays that are variously inclined with respect to the optical axis. For example, the chief intermediate rays are preferably variously inclined toward the optical axis in the direction of propagation with substantial axial symmetry. The chief intermediate rays preferably include intermediate rays that are inclined to the optical axis by at least one degree.

Movement of the object in one direction along the optical axis contributes toward a positive radial distortion in the image plane of the lens assembly, and movement of the object in an opposite direction along the optical axis contributes toward a negative radial distortion in the image plane of the lens assembly. However, the movement of the object in opposite directions along the optical axis preferably produces minimal magnification and non-orthogonal aberration effects in the image plane.

An environmental monitor can be used for monitoring environmental condition of the lens assembly, and a processor can be arranged to receive information from the environmental monitor and determine an amount of stage translation required to compensate for an expected distortion accompanying changes in the environmental conditions.

A lens assembly monitor can be used for monitoring operating conditions of the lens assembly, and a processor that receives information from the lens assembly monitor can be arranged to determine an amount of stage translation required to compensate for an expected radial distortion accompanying changes in the lens assembly. The changes in the lens assembly can include a change in the temperature or temperature distribution within one or more components of the lens assembly. The changes can also include a change in the size or shape of one or more components of the lens assembly. The lens assembly monitor can be used to detect changes in the object. An infrared imager, for example, can be used to produce infrared images of the object as a way to anticipate the distortion appearing at the image plane. The infrared imager can be coupled to a relay system that relays an illumination pattern to the object plane. The coupling allows the infrared imager to acquiring an image of the object.

The referenced stage can be a first of a plurality of stages, and a second of the stages can be used to translate a lens component of the lens assembly along the optical axis to vary magnification of the object in the image plane. A processor relates movements of the first and second stages to compensate for distortions accompanying the variation in magnification. The lens component translated by the second stage exhibits optical power and is preferably located adjacent to the object plane. Alternatively, the lens component translated by the second stage can be located adjacent to the image plane. A third of the stages can be arranged to translate the lens assembly together with the imaged object with respect to an image-receiving part for appropriately positioning the image plane of the lens assembly on a surface of the image-receiving part.

An illumination system is preferably arranged to output an illumination pattern having chief rays substantially matching the non-linear chief ray pattern at the object plane of the quasi-telecentric lens assembly. The illumination system can include an illuminator and a relay lens for optically coupling the illuminator to the quasi-telecentric lens assembly. The relay lens can transmit the desired illumination pattern from the illuminator to the quasi-telecentric lens assembly or can participate in forming the desired illumination pattern. For example, the relay lens can be arranged with a conventional telecentric object space but with a non-linear telecentric image space matching the non-linear telecentric object space of the quasi-telecentric lens. The relay lens can also be used to relay an image of a field stop, such as a cropping mask, onto the object plane of the quasi-telecentric lens assembly.

A method of influencing radial distortion in a quasi-telecentric lens in accordance with the invention includes directing light through a quasi-telecentric lens having a non-linear modification to telecentric object space. The object plane is axially translated through the non-linearly modified object space for increasing or decreasing radial distortion in an image plane of the telecentric lens without significantly varying magnification in the image plane.

The method can also be used to influence magnification in the image plane by axially translating a powered lens component of the quasi-telecentric lens. At least a portion of the axial translation of the object plane compensates for radial distortion accompanying the axial translation of the powered lens component. The powered lens component is preferably located among the powered lens components of the quasi-telecentric lens closest to one of the object plane and the image plane. For example, the powered lens component can be located closest to the object plane. The quasi-telecentric lens together with the object plane can be axially translated to maintain a desired external location of the image plane. The conditions that produce radial distortion errors in the image plane of the quasi-telecentric lens can be monitored and responded to by making the relative axial translation of the object plane.

In addition, the object plane of the quasi-telecentric lens is preferably illuminated by a quasi-telecentric illuminator having a non-linear modification to telecentric image space that matches the non-linear modification to the telecentric object space of the quasi-telecentric lens. This assures that, even under conditions of partial coherence illumination, the centroids of light energy through which the object points of the quasi-telecentric lens are projected onto the image plane of the quasi-telecentric lens correspond to the intended telecentric chief rays at the image plane of the quasi-telecentric lens.

BRIEF DESCRIPTION OF THE DRAWING FIGURES

Figure 5A:
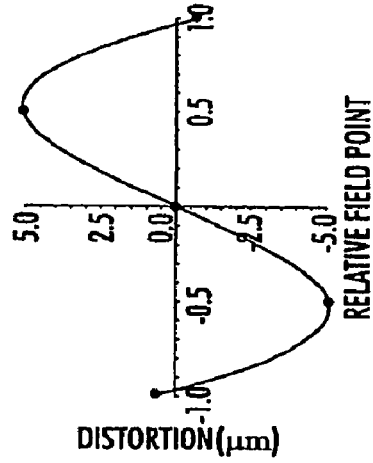
FIG. 5 is an enlarged cutaway view of telecentric object space showing axial adjustment possibilities for the reticle.
Figure 5B:
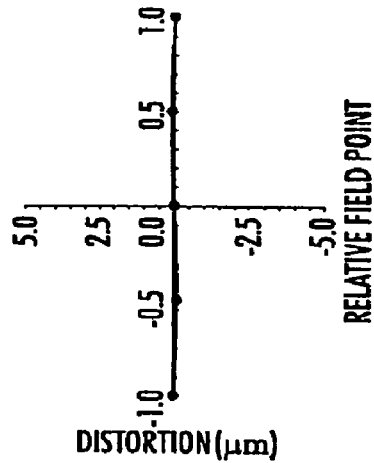
Figure 5C:
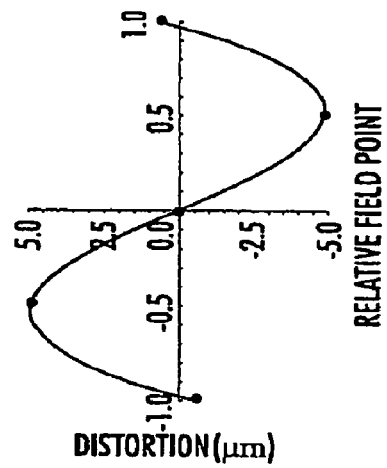

FIG. 5A-5C plot distortions (microns) in the image plane as a function of normalized radial field position associated with the radial distortion adjustment possibilities for the reticle.

FIG. 6 is an enlarged cutaway view of telecentric object space showing axial adjustment possibilities for a first optical component of the objective lens.

FIG. 6A-6C plot distortions (microns) in the image plane as a function of normalized radial field position associated with the magnification adjustment possibilities for the first optical component.

Figure 7:
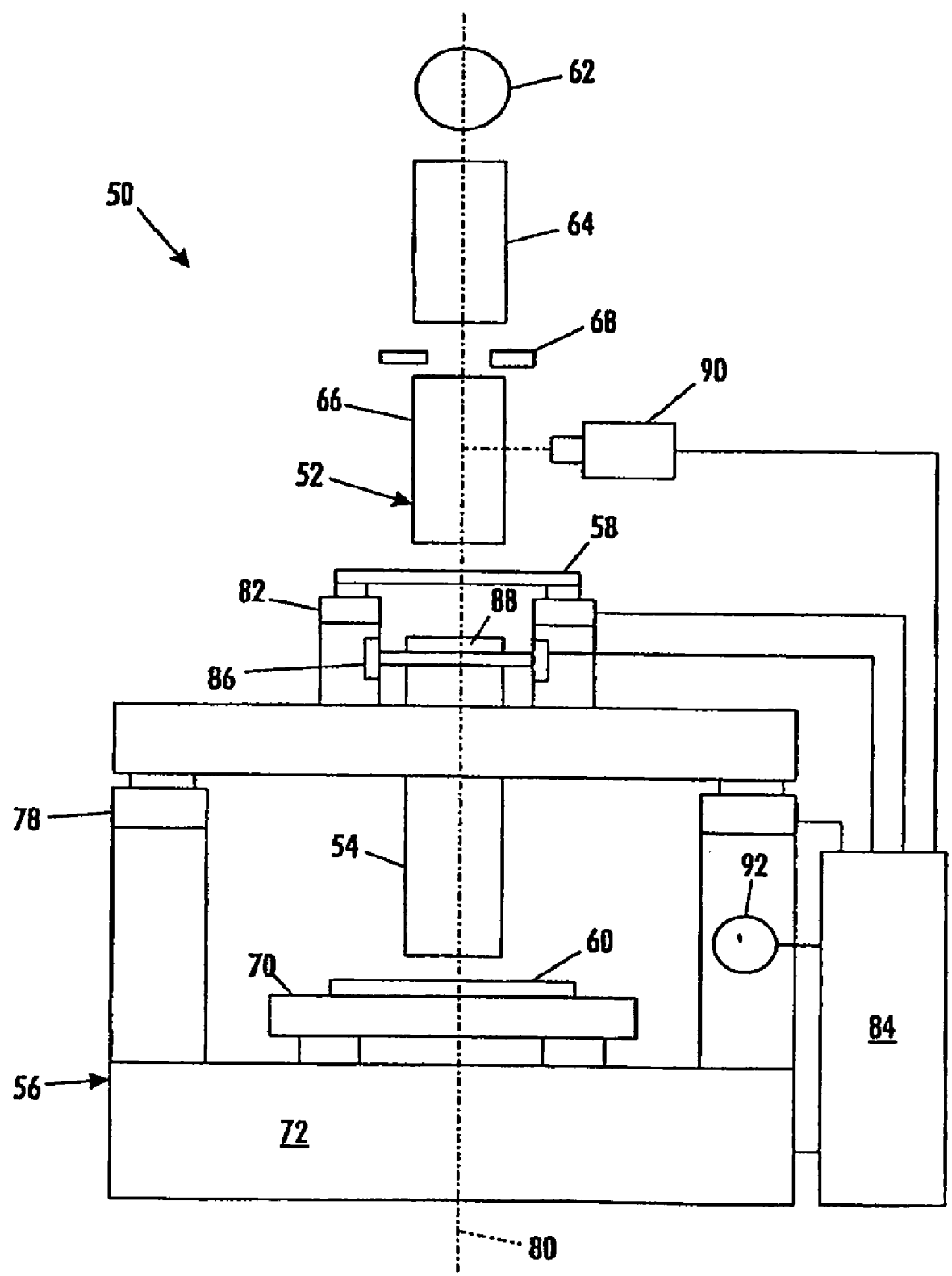

FIG. 7 depicts a mobile photolithographic imaging system incorporating a projection system in accordance with the invention.

DETAILED DESCRIPTION OF THE INVENTION

Figure 1:
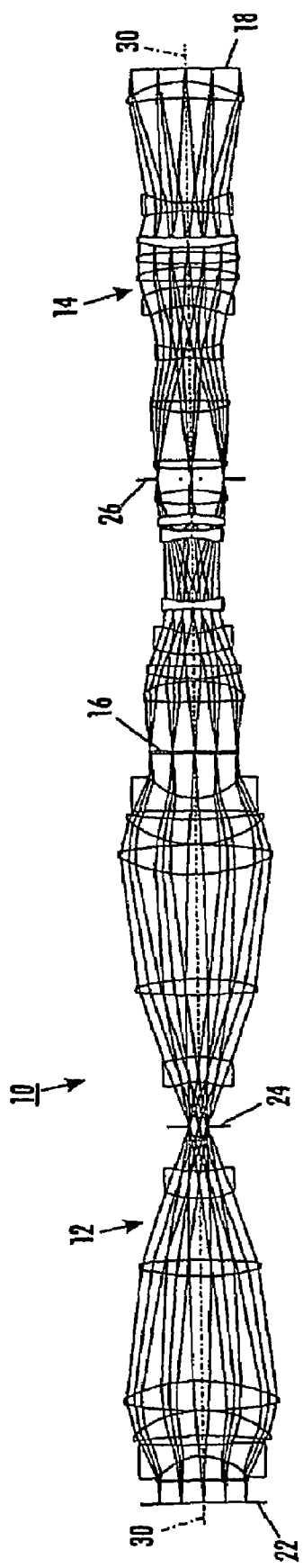
FIG. 1 is a diagram in side view of a doubly telecentric projection system having a relay lens and objective lens in which an illuminated reticle located in an object plane is projected onto an image plane.

In FIG. 1, a projection system 10 includes (a) a relay lens 12, which receives light from an illuminator (not shown) and relays a nearly uniform light plane bordered by cropping blades 22 to a reticle 16 (i.e., imaged object) at the object plane and (b) a quasi-doubly telecentric objective lens 14, which projects an image of a reticle 16 in a magnified size onto an image plane 18. A relay stop 24 within the relay lens 12 is arranged conjugate to the objective stop 26 within the objective lens 14, which can also be considered as an entrance pupil of the objective lens 14.

The reticle 16, which includes patterns intended for projection onto the image plane 18, can be sized larger than the field of view of the objective lens 14, and the cropping blades 22 mask the portions of the reticle 16 that are not intended for a particular projection. An image of the cropping blades 22 is relayed to the reticle 16 so that the blades remain within the depth of field of the objective lens 14. Alternatively, the cropping blades 22 could be located immediately adjacent to the reticle 16. However, required offsets for protecting the reticle 16 and other considerations such as cropping blade thickness can result in depth of field blurring. The problem is more acute for objective lenses having higher numerical apertures at the object plane, i.e., at the reticle 16. Thus, instead of mounting the cropping blades 22 next to the reticle 16, the relay lens 12 relays an image of the cropping blades 22 directly onto the reticle 16. This also moves a heat source away from the reticle 16 and allows thicker cropping blades 22 to be used.

Figure 2:
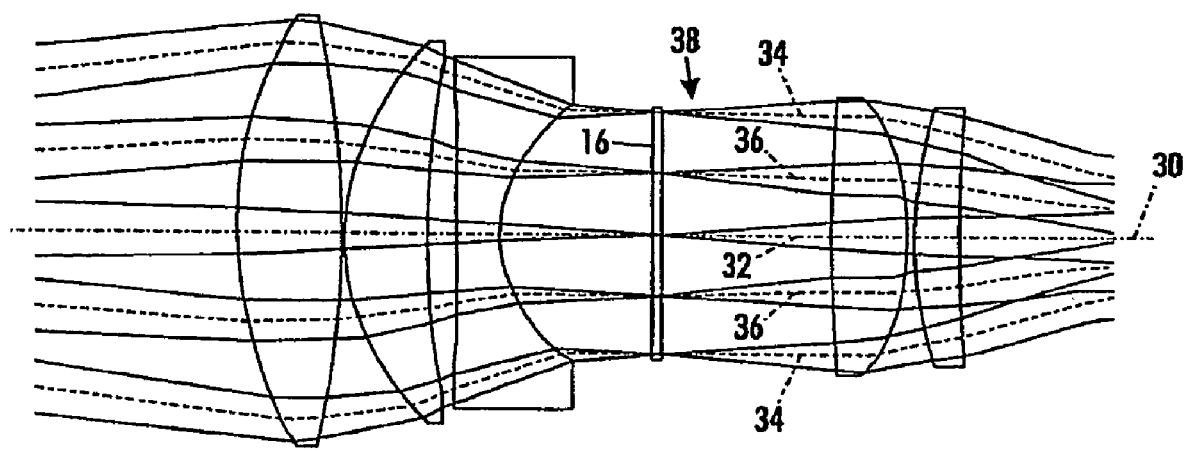
FIG. 2 is an enlarged cutaway view of the projection system near the reticle.
Figure 3:
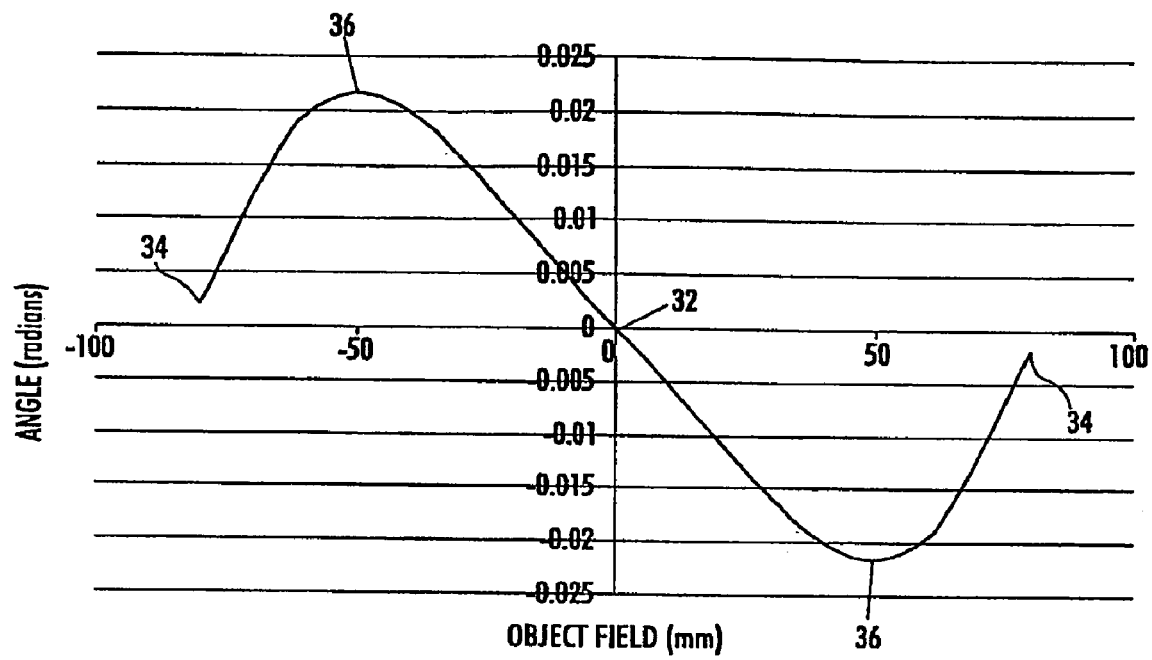
FIG. 3 is a graph showing an angular variation (radians) in the inclination of the chief rays passing through the reticle as a function of displacement (millimeters) from the center of the object field.
Figure 4:
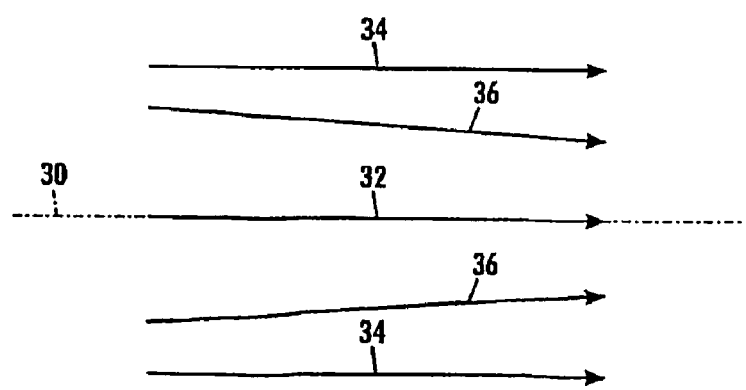
FIG. 4 depicts exemplary paraxial, intermediate, and full-field rays in telecentric object space.

The objective lens 14 is quasi-doubly telecentric; i.e., true telecentric adjacent to the image plane 18 but only quasi-telecentric adjacent to the object plane at the reticle. As better seen in the enlarged cutaway view of FIG. 2, both chief paraxial rays 32 and chief full-field rays 34 passing through the reticle 16 extend parallel to an optical axis 30 of the projection system 10. However, chief intermediate rays 36 tip slightly toward the optical axis 30 within the same substantially telecentric object space 38, such as through an angle of up to approximately 1.25 degrees (0.22 radians). The variation in the inclination of the chief intermediate rays 36 to the optical axis 30 is preferably modeled after a second or other even ordered function, such as plotted in the graph of FIG. 3, in which the inclination variation of the intermediate chief rays 36 increases with their radial distance from the closer of the chief paraxial or the chief full-field rays 32 or 34. This telecentric variation appears as a spherical aberration in the entrance pupil 26 of the objective lens 14.

Figure 5:
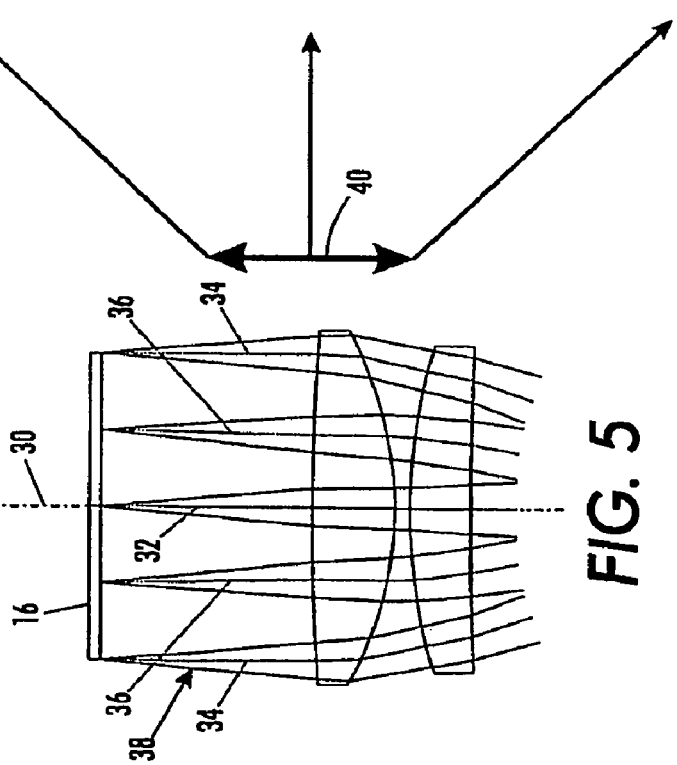

The reticle 16 is preferably mounted on an adjustable stage or other translating mechanism such as voice coils (not shown) for translating the reticle 16 limited distances along the optical axis 30 as shown in FIG. 5 by double arrow 40. At a given design position, no radial distortion is apparent in the image plane 18 as shown by the graph of FIG. 5B. However, translation of the reticle 16 in either direction along the optical axis 30 through the telecentric object space 38 has an effect of varying distortions of the projection system 10. Translation of the reticle 16 in the direction of the relay lens 12 has the effect of producing a positive radial distortion as plotted in FIG. 5A, and translation of the reticle 16 in the opposite direction toward the objective lens 14 has the effect of producing a negative radial distortion as plotted in FIG. 5C. A controller (not shown) can be connected to the reticle mount for adjusting distortion in response to changing conditions. For example, the distortion itself can be monitored and corrections made for reducing the monitored distortion, or related conditions can be monitored, such as temperature, and corrections made based on predictable effects of the changing conditions on distortion.

The same telecentric alteration at the object plane can be further exploited to support magnification adjustments, which like distortion, can be altered by environmental influences or other changing conditions. The magnification correction can be made as shown in FIG. 6 by translating a first optic (i.e., "first glass") 42 of the objective lens 14 along the optical axis 30 as shown by the double arrow 44 in concert with a translation of the reticle 16 (as shown in FIG. 5) to undo any unwanted radial distortion created by the translation of the first optic 42. At a given design position, a desired amount of magnification is apparent in the image plane 18 as shown on the graph of FIG. 6B. Translation of the first optic 42 in the direction of the relay lens 12 has the effect of producing a positive magnification as plotted in FIG. 6A. Translation of the first optic 42 in the opposite direction toward the objective lens 14 has the effect of producing a negative magnification as plotted in FIG. 6C.

The first optic 42 can be mounted on a stage or other translating mechanism such as piezoelectric transducers (not shown). Alternatively, one stage could be arranged for translating both the reticle 16 and the first optic 42 and another stage could be arranged for further translating one or the other of the reticle 16 and the first optic 42. The same or a different controller (not shown) can be used to monitor the amount of magnification reduction produced in the image plane 18 or other conditions predictably related to the magnification reduction and adjust the positions of the reticle 16 and first optic 42 accordingly. Translations of the reticle 16 and the first optic 42 can also have the effect of axially displacing the location of the image plane 18. This can be corrected by translating the entire objective lens 14 on another stage having lifts for raising and lowering the objective lens 14 together with the reticle 16.

Alternatively, one or more powered optical components of the objective lens 14 can be translated for making the desired magnification corrections, particularly powered optical components in the vicinity of the telecentric image or object space. Movement of the chosen optical component preferably has the least effect introducing distortions beyond radial distortion or magnification. That is, the chosen component is preferably forgiving with respect to its axial position for introducing other errors, such as non-orthogonal errors. Any unwanted radial distortion can be corrected by moving the reticle/object plane. For example, a last optic (i.e., "last glass") 46 of the projection lens 14 closest to the image plane 18 can be translated along the optical axis 30 for making similar changes to magnification, while having a minimal effect on the location of the image plane 18.

Other chief ray patterns can be used to render the design sensitive to other distortions with changes in working distance. For example, a fifth order distortion sensitivity can be created by orienting chief mid-field rays also parallel to the optical axis and varying the inclination of the other rays as a function of their radial distance from the closest of the paraxial, midfield, or full-field rays that all extend parallel to the optical axis. However, the alternative ray patterns preferably preserve at least the paraxial and full-field rays parallel to the optical axis to distinguish distortion sensitivity from changes in magnification.

While telecentric object space 38 can be configured with various nonlinear chief ray patterns, the objective lens 14 preferably remains truly telecentric in image space. Both good placement and low telecentricity errors are evident at the image plane 18, where the chief rays remain parallel to the optical axis.

The following tables listing design specifications for an exemplary relay lens 12 and a matched objective lens 14. The design is quasi-telecentric and is substantially balanced on either side of the aperture stops in element form and material to reduce odd order aberrations such as coma and to limit the number of different elements within the design.

Relay Lens Fabrication Data

| Element | Radius of Curvature Front | Radius of Curvature Back | Thickness | Aperture Diameter Front | Aperture Diameter Back | Material |
|---|---|---|---|---|---|---|
| OBJECT | INF | | 44.1379 | | | |
| 1 | INF | INF | 4.3000 | 165.8307 | 166.2155 | SIO2 |
| | | | 46.8816 | | | |
| 2 | −104.0409 CC | 2226.9485 CC | 25.6403 | 166.8749 | 224.4487 | SIO2 |
| | | | 17.8014 | | | |
| 3 | −677.5359 CC | −178.7235 CX | 51.1400 | 231.6797 | 244.0225 | PBM18Y Ohara |
| | | | 1.0000 | | | |
| 4 | 703.1659 CX | −299.7709 CX | 60.0792 | 273.6760 | 276.0145 | SIO2 |
| | | | 213.6768 | | | |
| 5 | 355.7864 CX | −2050.6270 CX | 32.4361 | 215.4036 | 210.7433 | SIO2 |
| | | | 128.8237 | | | |
| 6 | 139.9641 CX | 111.6454 CC | 55.0000 | 123.9744 | 88.4198 | SIO2 |
| | | | 94.0830 | | | |
| | | | APERTURE STOP | 33.2957 | | |
| | | | 94.0830 | | | |
| 7 | −111.6454 CC | −139.9641 CX | 55.0000 | 88.3915 | 123.9313 | SIO2 |
| | | | 128.8237 | | | |
| 8 | 2050.6270 CX | −355.7864 CX | 32.4361 | 210.6429 | 215.3071 | SIO2 |
| | | | 213.6768 | | | |
| 9 | 299.7709 CX | −703.1659 CX | 60.0792 | 275.8684 | 273.5220 | SIO2 |
| | | | 1.0000 | | | |
| 10 | 178.7235 CX | 677.5359 CC | 51.1400 | 243.9200 | 231.5508 | PBM18Y Ohara |
| | | | 17.8014 | | | |
| 11 | −2226.9485 CC | 104.0409 CC | 25.6403 | 224.3043 | 166.8064 | SIO2 |
| | | | 91.0196 | | | |
| 12 | INF | INF | 4.3000 | 160.3002 | 159.9416 | SIO2 |
| IMAGE | INF | | 159.9416 | | | |

Objective Lens Fabrication Data

| Element | Radius of Curvature Front | Radius of Curvature Back | Thickness | Aperture Diameter Front | Aperture Diameter Back | Material |
|---|---|---|---|---|---|---|
| OBJECT | INF | | 98.8673 | | | |
| 1 | 1602.5020 CX | −202.3611 CX | 38.8682 | 178.7816 | 180.1374 | SIO2 |
| | | | 7.0000 | | | |
| 2 | 347.6276 CX | 2949.4535 CC | 29.2046 | 166.3521 | 158.2304 | SIO2 |
| | | | 20.6023 | | | |
| 3 | 199.8183 CX | 94.4280 CC | 40.0000 | 139.6297 | 110.9390 | SIO2 |
| | | | 48.8757 | | | |
| 4 | 793.1909 CX | 124.3330 CC | 19.7476 | 101.6115 | 95.1142 | SIO2 |
| | | | 133.3812 | | | |
| 5 | −158.1986 CC | 674.5769 CC | 17.0000 | 99.6948 | 107.2745 | PBM18Y Ohara |
| | | | 9.9549 | | | |
| 6 | −1889.7778 CC | −170.0924 CX | 21.4065 | 111.3332 | 116.1943 | SIO2 |
| | | | 23.4885 | | | |
| 7 | 1255.2681 CX | −159.0652 CX | 26.7841 | 125.3039 | 127.0018 | SIO2 |
| | | | 21.0000 | | | |
| | | | APERTURE STOP | 119.9009 | | |
| | | | 21.0000 | | | |
| 8 | 529.1464 CX | −999.6629 CX | 17.8512 | 126.6781 | 127.9378 | SIO2 |
| | | | 95.9908 | | | |
| 9 | 207.8959 CX | −8081.8685 CX | 25.1353 | 138.2623 | 136.1535 | SIO2 |
| | | | 82.3740 | | | |

-continued

Objective Lens Fabrication Data

| Element | Radius of Curvature Front | Radius of Curvature Back | Thickness | Aperture Diameter Front | Aperture Diameter Back | Material |
|---|---|---|---|---|---|---|
| 10 | −520.9933 CC | 173.6855 CC | 18.1895 | 116.4648 | 114.5312 | PBM18Y Ohara |
|  |  |  | 88.4088 |  |  |  |
| 11 | −150.1389 CC | −213.0482 CX | 40.0000 | 136.8564 | 159.8929 | SIO2 |
|  |  |  | 24.4118 |  |  |  |
| 12 | 1288.0434 CX | −298.8531 CX | 29.3711 | 179.3126 | 182.3602 | SIO2 |
|  |  |  | 7.0000 |  |  |  |
| 13 | 509.4466 CX | −637.4366 CX | 27.0839 | 184.5771 | 183.7623 | SIO2 |
|  |  |  | 7.0000 |  |  |  |
| 14 | 297.7632 CX | 987.5796 CC | 21.6966 | 177.1968 | 172.8495 | SIO2 |
|  |  |  | 37.9683 |  |  |  |
| 15 | −415.1246 CC | 163.4446 CC | 17.0000 | 160.9247 | 153.5272 | SIO2 |
|  |  |  | 218.2357 |  |  |  |
| 16 | −542.3254 CC | −194.5365 CX | 37.1022 | 203.4946 | 208.4570 | SIO2 |
|  |  |  | 28.0000 |  |  |  |
| IMAGE | INF |  |  | 200.0008 |  |  |

For interpreting the tables, a positive radius indicates the center of curvature is to the right and a negative radius indicates the center of curvature is to the left. All dimensions are given in millimeters, and thickness is the axial distance to next surface. The image diameter is a paraxial value, rather than a ray-traced value. The lens is operated at a reference wavelength of 366.0 nanometers through s spectral region from 363.5 nanometers to 368.5 nanometers.

Similar designs having the desired departure from telecentricity can be achieved using conventional lens design software, such as Code 5 by Optical Research Associates, Pasadena, Calif., by specifying the desired orientation pattern of the chief rays. The software accommodates the desired orientation pattern of the chief rays while achieving a design with little or no distortion at the image plane. Other lens design software that can be used for this purpose includes ZMAX optical design code from Focus Software, Tucson, Ariz., and OSLO optical design software from Lambda Research Corporation, Littleton, Mass. The design, however, is more sensitive to the exact placement of the object plane. This sensitivity is exploited to produce controlled amounts of radial distortion.

FIG. 7 depicts a mobile photolithographic imaging system 50, also referred to as a "stepper", incorporating a projection system 52 similar to the projection system 10 described above. An objective lens 54 supported by a frame 56 projects an image of a reticle 58 onto a panel 60. Illumination is provided by a light source 62, such as a high-pressure mercury arc lamp. An illuminator 64 includes a light tunnel that produces a uniform distribution of light. A relay lens 66 receives light from the illuminator 64 through a cropping mask 68, and transmits an image of the cropping mask 68 bordering the uniform light from the illuminator 64 onto the reticle 58.

The entire panel 60 cannot be imaged at once, so the frame 56 supports an XY-axis translational stage 70 on a base 72 for translating the panel 60 through a range of positions for collectively illuminating a desired working area of the panel 60. The projection system 52 is supported on a Z-axis translational stage 78 for adjusting the image distance of the projection system 52 from the panel 60 along an optical axis 80 of the projection system 52. The reticle 58 is supported within the projection system on an XYZ translational stage 82. The XY component of the XYZ translational stage 82 provides for illuminating different portions of the reticle 58, which can also be larger than the field of view of the projection system 52. A controller 84 relates translation of the reticle 58 to the translation of the panel 60 so that a desired pattern on the reticle 58 can be imaged onto the panel 60. The Z component of the XYZ translational stage 82 adjusts the working distance of the objective lens 54 from the reticle 58 for making radial distortion adjustments. Another Z translational stage 86 translates an optical component 88 of the objective lens 54 along the optical axis 80 for making magnification adjustments. Preferably, the optical component 88 is the powered optical component closest to the reticle 58.

An infrared camera 90 is optically coupled to the relay lens 66 for monitoring a thermal profile of the reticle 58. Other sensors 92 monitor ambient conditions such as ambient temperature and pressure within the environment of the projection system 52. Information regarding the thermal profile of the reticle 58 as well as ambient temperature and pressure of the projection system environment reach the controller 84 and based on empirical data relating such information to optical performance of the projection system 52, adjustments are made to either or both the working distance of the objective lens 54 to counteract image distortion or the axial position of the optical component 88 for adjusting magnification.

The projection system 52 is arranged to provide a radial distortion adjustment by making the non-linear alteration to telecentric object space near the reticle 58 and by controlling the XYZ translational stage 82 to alter the working distance between the objective lens 54 and the reticle 58. A magnification adjustment is provided by the Z translational stage 86 that translates the optical component 88 along the optical axis 80. Conditions that produce radial distortion or magnification errors are monitored such as by sensors 90 and 92 and empirical knowledge regarding the response of the projection system 52 is used to make compensatory image distortion and magnification adjustments. Dynamic adjustments can be maintained to assure better and more consistent performance of the projection system 52.

The illuminator 64 together with the relay lens 66 convey an illumination pattern to the reticle 58 in a quasi-telecentric form in which the chief rays at the image plane of the relay lens 66 are substantially aligned with the chief rays of the object plane of the objective lens 54 so that the entrance pupil of the objective lens 54 is optimally filled for the objective lens design. The desired ray configuration of the illumination pattern at the reticle 58 can be produced at the image plane of the illuminator 64 and reproduced by the relay lens 66 at the object plane of the objective lens 54, or the relay lens 66 can be arranged to convert the illumination pattern at the image plane of the illuminator (i.e., the object plane of the relay lens 66) to the desired ray configuration at the object plane of the objective lens 54 (i.e., the image plane of the relay lens 66). For example, the relay lens 66 can be arranged quasi-doubly telecentric with a true telecentric object space matching a true telecentric image space of the illuminator 64 and a quasi-telecentric image space matching the quasi-telecentric object space of the objective lens 54. In this way, a conventional illuminator 64 with a telecentric output can be used.

The matching alignments of the chief rays at the image plane of the relay lens 66 with the chief rays at the object plane of the objective lens 54 assure that the centers of illumination, also referred to as centroids of light energy, at the image plane of the objective lens 54 remain aligned with the telecentric chief rays of the objective lens 54 at the image plane of the objective lens. With this alignment, various forms of partial coherence illumination can be used while preserving the intended telecentric nature of the illumination at the image plane of the objective lens 54.

Although described with respect to particular embodiments for featuring various capabilities of the invention, those of skill in the art will appreciate the range of modifications that can be made within the overall teaching of this invention. For example, quasi-telecentric lenses used for purposes of the invention can be arranged for magnification or enlargement and the light direction through such lenses can be reversed. The object plane, image plane, or optical component can be translated directly or the remaining lens structure can be translated with respect to any one of them. Other conditions known to affect the performance of optical systems can also be monitored for purposes of correcting distortion or magnification.

The invention claimed is:

1. An optical imaging system comprising
a quasi-telecentric lens assembly in which chief rays emanating from an object plane include paraxial rays and reference rays that are located at a given radial distance from the paraxial rays, the reference rays and paraxial rays extending substantially parallel to an optical axis of the imaging system, and the chief rays emanating from the object plane also include other chief rays that vary in inclination to the optical axis of the lens assembly, and
a stage for relatively translating an object intended for imaging by the imaging system with respect to the lens assembly along the optical axis to compensate for distortion otherwise apparent in an image plane of the lens assembly.

2. The optical imaging system of claim 1 in which the reference rays are full-field rays.

3. The imaging system of claim 1 including an entrance pupil within which the chief rays emanating from the object plane express a spherical aberration.

4. The imaging system of claim 2 in which the other chief rays between the chief paraxial and full-field rays include chief intermediate rays that are variously inclined with respect to the optical axis substantially as a function of the radial distance of the other chief rays from the closer of the paraxial and the full-field rays.

5. The imaging system of claim 4 in which the chief intermediate rays are variously inclined toward the optical axis in the direction of propagation with substantial axial symmetry.

6. The imaging system of claim 4 in which the chief intermediate rays include rays inclined by at least one degree to the optical axis.

7. The imaging system of claim 1 in which movement of the object in one direction along the optical axis contributes toward a positive radial distortion in the image plane of the lens assembly and movement of the object in an opposite direction along the optical axis contributes toward a negative radial distortion in the image plane of the lens assembly.

8. The imaging system of claim 7 in which the movement of the object in opposite directions along the optical axis has minimal non-orthogonal effects with respect to other aberrations in the image plane.

9. The imaging system of claim 1 further comprising an environmental monitor for monitoring environmental condition of the lens assembly and a processor that receives information from the environmental monitor and determines an amount of stage translation required to compensate for an expected distortion accompanying changes in the environmental conditions.

10. The imaging system of claim 1 further comprising a lens assembly monitor for monitoring operating conditions of the lens assembly and a processor that receives information from the lens assembly monitor and determines an amount of stage translation required to compensate for an expected distortion accompanying changes in the lens assembly.

11. The imaging system of claim 10 in which the changes in the lens assembly include a change in the temperature or temperature distribution within one or more components of the lens assembly.

12. The imaging system of claim 10 in which the changes in the lens assembly include a change in the size or shape of one or more components of the lens assembly.

13. The imaging system of claim 10 in which the lens assembly monitor detects changes in the object.

14. The imaging system of claim 10 further comprising an infrared imager for producing an infrared image of the object.

15. The imaging system of claim 14 further comprising a relay system that relays an illumination pattern to the object plane and the infrared imager is optically coupled to the relay system for imaging the object.

16. The imaging system of claim 1 in which the stage is a first of a plurality of stages and a second of the stages translates a lens component of the lens assembly along the optical axis to vary magnification of the object in the image plane.

17. The imaging system of claim 16 further comprising a processor that relates movements of the first and second stages to compensate for distortion accompanying the variation in magnification.

18. The imaging system of claim 17 in which the lens component translated by the second stage exhibits optical power and is located adjacent to the object plane.

19. The imaging system of claim 17 in which the lens assembly is quasi-telecentric adjacent to both the object plane and the image plane, and the lens component translated by the second stage exhibits optical power and is located adjacent to the image plane.

20. The imaging system of claim 16 in which a third of the stages relatively translates the lens assembly together with the imaged object with respect to an image-receiving part for positioning the image plane of the lens assembly on a surface of the image-receiving part.

21. The imaging system of claim 1 further comprising a quasi-telecentric illuminator having chief rays approaching an image plane that are aligned with the paraxial, reference, and other chief rays that emanate from the object plane of the quasi-telecentric lens assembly.

22. The imaging system of claim 21 in which the quasi-telecentric illuminator includes chief paraxial and full-field rays that extend parallel to the optical axis and other chief rays that are variously inclined with respect to the optical axis substantially as a function of the radial distance of the other chief rays from the closer of the paraxial and the full-field rays.

23. A method of influencing radial distortion in a quasi-telecentric lens comprising steps of
directing light through a quasi-telecentric lens having a non-linear modification to telecentric object space, and
relatively axially translating an object plane through the non-linearly modified object space for increasing or decreasing radial distortion in an image plane of the quasi-telecentric lens without significantly varying magnification in the image plane.

24. The method of claim 23 including an additional step of relatively axially translating a powered lens component of the telecentric lens to alter the magnification in the image plane.

25. The method of claim 24 in which at least a portion of the axial translation of the object plane compensates for radial distortion accompanying the axial translation of the powered lens component.

26. The method of claim 24 in which the powered lens component is located among the powered lens components of the telecentric lens closest to one of the object plane and the image plane.

27. The method of claim 26 in which the powered lens component is located closest to the object plane.

28. The method of claim 23 including an additional step of relatively axially translating the telecentric lens together with the object plane to maintain a desired external location of the image plane.

29. The method of claim 23 including an additional step of monitoring conditions that produce radial distortion errors in the image plane of the telecentric lens and responding by making the relative axial translation of the object plane.

30. The method of claim 23 in which the step of directing light includes illuminating the object plane of the quasi-telecentric lens with a quasi-telecentric illuminator having a non-linear modification to telecentric image space that matches the non-linear modification to the telecentric object space of the quasi-telecentric lens.

31. An optical projection system comprising
a quasi-telecentric illumination system having a non-linear telecentric image space,
a quasi-telecentric projection lens optically coupled to the illumination system and having a non-linear telecentric object space and a substantially true telecentric image space, and
the non-linear telecentric image space of the illumination system being matched to the non-linear telecentric object space of the projection lens for at least partially filling an entrance pupil of the projection lens.

32. The system of claim 31 in which chief rays approaching the image plane of the illumination system are substantially matched to chief rays emanating from the object plane of the projection lens.

33. The system of claim 32 in which the chief rays of both the illumination system and the projection lens include paraxial rays, reference rays, and intermediate rays located between the paraxial and reference rays, wherein the chief paraxial and reference rays extend substantially parallel to a common optical axis of the illumination system and projection lens, and the chief intermediate rays vary in inclination to the common optical axis.

34. The system of claim 33 in which the chief intermediate rays vary in inclination to the common optical axis substantially as a function of the radial distance of the other chief rays from the closer of the paraxial and the reference rays.

35. The system of claim 31 further comprising a stage for relatively translating an object intended for imaging by the projection lens with respect to the projection lens through the quasi-telecentric object space of the projection lens to compensate for distortion otherwise apparent in an image plane of the projection lens.

36. The system of claim 31 in which the quasi-telecentric illumination system includes both an illuminator and a relay lens that couples the illuminator to the quasi-telecentric projection lens.

37. The system of claim 36 in which the relay lens is quasi-telecentric having a true telecentric object space and a substantially non-linear telecentric image space matching the substantially non-linear telecentric object space of the projection lens.

* * * * *